United States Patent
Ramachandran et al.

(10) Patent No.: US 10,520,531 B2
(45) Date of Patent: Dec. 31, 2019

(54) TIME INTERVAL PRODUCTION MEASUREMENT AND ENERGY STORAGE PERFORMANCE ANALYTICS IN RENEWABLE DC ENERGY SYSTEMS

(71) Applicant: Locus Energy, Inc., Hoboken, NJ (US)

(72) Inventors: Anil Ramachandran, Santa Clara, CA (US); Shawn Kerrigan, Redwood City, CA (US); Michael Herzig, Leonia, NJ (US)

(73) Assignee: LOCUS ENERGY, INC., Hoboken, NJ (US)

( * ) Notice: Subject to any disclaimer, the term of this patent is extended or adjusted under 35 U.S.C. 154(b) by 0 days.

(21) Appl. No.: 15/374,331

(22) Filed: Dec. 9, 2016

(65) Prior Publication Data

US 2017/0176505 A1  Jun. 22, 2017

Related U.S. Application Data

(60) Provisional application No. 62/269,162, filed on Dec. 18, 2015.

(51) Int. Cl.
*G01R 22/10* (2006.01)
*H02S 40/32* (2014.01)
(Continued)

(52) U.S. Cl.
CPC ......... *G01R 22/10* (2013.01); *G06Q 30/0283* (2013.01); *G06Q 50/06* (2013.01);
(Continued)

(58) Field of Classification Search
None
See application file for complete search history.

(56) References Cited

U.S. PATENT DOCUMENTS

| | | |
|---|---|---|
| 6,311,137 B1 | 10/2001 | Kurokami et al. |
| 6,507,194 B2 | 1/2003 | Suzuki |

(Continued)

OTHER PUBLICATIONS

Yinghao Shan, A Model Predictive Control of Renewable Energy Based AC Microgridswithout Any PID Regulators, Apr. 2018, 6 pages.*

(Continued)

*Primary Examiner* — Tung S Lau
(74) *Attorney, Agent, or Firm* — Sheridan Ross PC

(57) ABSTRACT

A system and method in which production measurement for renewable energy is obtained in a storage-independent manner. Energy storage is separated out from the renewable generation to provide individual performance analytics. A monitoring unit uses device communication and metering to enable revenue-grade production measurement for renewable source and energy storage periodically at specified time intervals. The production measurement for the renewable source is obtained in a form that would be comparable to renewable installations without storage, for accurate billing, maintenance, and performance analytics. Additionally, multiple energy flows may be used by the monitoring unit to arrive at a storage efficiency value that can be attributed to the storage unit and how the storage unit is operated in the renewable energy system. The storage efficiency quantifies efficiency losses arising from the use of a storage unit to estimate the actual impact of storage and the charge controller algorithm on energy production.

18 Claims, 3 Drawing Sheets

(51) Int. Cl.
*H02S 40/38* (2014.01)
*G06Q 30/02* (2012.01)
*G06Q 50/06* (2012.01)
*H02J 7/35* (2006.01)

(52) U.S. Cl.
CPC .............. *H02J 7/355* (2013.01); *H02S 40/32* (2014.12); *H02S 40/38* (2014.12)

(56) References Cited

U.S. PATENT DOCUMENTS

| | | | |
|---|---|---|---|
| 8,345,454 | B1 | 1/2013 | Krolak et al. |
| 9,824,838 | B2 * | 11/2017 | Faulkner ................ H01H 33/16 |
| 2007/0174219 | A1 | 7/2007 | Bryant et al. |
| 2007/0246943 | A1 * | 10/2007 | Chang ....................... H02J 3/28 |
| | | | 290/44 |
| 2008/0195561 | A1 | 8/2008 | Herzig |
| 2010/0286937 | A1 * | 11/2010 | Hedley ................. G06Q 30/02 |
| | | | 702/60 |
| 2011/0282602 | A1 * | 11/2011 | Hoff ........................ H02S 10/00 |
| | | | 702/60 |
| 2012/0199558 | A1 * | 8/2012 | Faulkner ................ H01H 33/16 |
| | | | 218/143 |
| 2013/0099564 | A1 * | 4/2013 | Hsu .......................... H02J 3/382 |
| | | | 307/23 |
| 2013/0256274 | A1 * | 10/2013 | Faulkner .............. H01H 33/596 |
| | | | 218/143 |
| 2014/0149076 | A1 | 5/2014 | Jarnason et al. |
| 2018/0054161 | A1 * | 2/2018 | Ramachandran .. G06Q 30/0283 |

OTHER PUBLICATIONS

Yu Ru, Storage Size Determination for Grid-Connected Photovoltaic Systems, Jan. 10, 2012, pp. 13.*
B. Marion, Performance Parameters for Grid-Connected PV Systems, Feb. 2005, 9 ;pages.*
Roberto S. Faranda, The Optimum PV Plant for a Given Solar DC/AC Converter, May 26, 2015, 18 pages.*
International Search Report and Written Opinion for International (PCT) Patent Application No. PCT/US2016/065880, dated Mar. 23, 2017, 14 pages.

* cited by examiner

TIME INTERVAL PRODUCTION MEASUREMENT AND ENERGY STORAGE PERFORMANCE ANALYTICS IN RENEWABLE DC ENERGY SYSTEMS

CROSS-REFERENCE TO RELATED APPLICATIONS

This application claims the priority benefit under 35 U.S.C. § 119(e) of U.S. Provisional Application No. 62/269,162 filed on Dec. 18, 2015, the disclosure of which is incorporated herein by reference in its entirety.

TECHNICAL FIELD

The present disclosure generally relates to renewable energy systems such as, for example, Photovoltaic (PV) solar systems, having on-site energy storage. More particularly, and not by way of limitation, particular embodiments of the present disclosure are directed to measurement of the produced renewable energy in a storage-independent manner along with the quantification of the efficiency of the energy storage unit-based system.

BACKGROUND

Renewable energy, like wind energy and solar energy, is increasingly being explored to meet the ever-growing demand for energy in an environmentally-responsible manner. A photovoltaic (PV) system is an example of a renewable energy system that converts the sun's radiation into usable electricity. PV systems range from small, rooftop-mounted or building-integrated systems with capacities from a few to several tens of kilowatts, to large, utility-scale power stations of hundreds of megawatts. Some PV systems may be connected to an electrical grid to enable transmission and distribution of their generated-electricity to other participants in the utility market. On the other hand, some PV systems, such as, for example, residential or small-scale PV systems, may be off-grid or stand-alone systems.

FIG. 1 is a simplified block diagram of an exemplary renewable energy system 10 with on-site energy storage. In the present disclosure, a PV solar system is used as an example of a renewable energy system. Therefore, the discussion herein is primarily provided in the context of a PV solar system. However, it is understood that the discussion remains equally applicable to other renewable energy systems as well. When the renewable energy system 10 is a typical PV solar system or PV solar site, it may include a renewable Direct Current (DC) energy source 12 in the form of a solar/PV array. The PV system 10 also may comprise a number of Balance of System (BOS) components, three of which—a charge controller 14, a storage (battery) unit 15, and an inverter 16—are shown in FIG. 1 by way of an example. The BOS components 14-16 may balance the power-generating sub-system of the solar array 12 with the power-using side (the electrical load). For ease of illustration, only the Alternating Current (AC) electrical service interconnect point is shown using block 18 in FIG. 1; any DC load portion is omitted. An AC load (such as, for example, a residential electrical load) or AC power grid (not shown) may receive the AC inverter output through the AC interconnect point 18.

The charge controller 14 may regulate the electrical input received from the PV array 12 so as to satisfy the demand for the Direct Current (DC) load (not shown) and transfer any additional electricity for storage into the battery unit 15. On the other hand, when the generated electricity (by the DC energy source or PV array 12) is not sufficient to satisfy the requirements of the DC load, the charge controller may access the stored electricity from the battery unit 15 and supply it to the DC load. The battery or storage unit 15 also may supply electrical energy to an inverter 16, which may convert the stored electric current from DC to AC to be delivered to the AC service interconnect point 18. The DC load (not shown) may represent systems or devices that operate on DC current, whereas the AC interconnect point 18 may serve systems or devices that operate on AC current. Although not shown in FIG. 1, the PV site 10 also may include additional BOS components such as, for example, power-conditioning equipment, structures and racking systems for mounting various BOS components and solar arrays, electrical wiring, cabling, and interconnections, and other electrical accessories to set up a working PV site. In some implementations, the PV site 10 also may use a solar tracking system (not shown) to improve the system's overall performance.

SUMMARY

As prices for storage decline, electric energy storage units—like the battery unit 15 in FIG. 1—are increasingly collocated with renewable energy systems. However, for billing as well as performance analytics, measurement of renewable energy production in general (and PV solar in particular)—such as, for example, the energy production by the renewable energy source 12 in FIG. 1—may need to be achieved independent of the charging and discharging of energy storage at the same site so as to provide an accurate measurement of the actual, usable quantity of the generated DC energy delivered as AC energy to the AC load.

Currently, AC output from the inverter such as, for example, the inverter 16 in FIG. 1, or DC input to the charge controller such as, for example, the charge controller 14 in FIG. 1, is metered as representing the produced energy. However, simply metering inverter output to the AC load as an indicator of renewable generation no longer works in case of a storage-based renewable energy system, such as a PV solar system, because the observed inverter output is the result of solar generation (for example, by a PV array) with battery discharge power added to it or the battery charge power subtracted from it, with the inverter efficiency superimposed on it. Furthermore, the inverter output also may be affected by the storage/battery unit's efficiency of charging and discharging the battery over the long term. Similarly, simply using the solar current (output by a PV array) as measured by a DC sub-meter or reported by a charge controller directly as production measurement is inaccurate as well because it would measure the DC side of the renewable generation, but would not measure the actual usable quantity of this energy delivered as AC metered power. For example, the usable quantity may be less than the produced energy when the battery is charging and may depend on the inverter efficiency as well. Furthermore, DC-side based measurements do not accurately provide the correct timestamp when the power was actually delivered (to the AC load), which is often important for billing and system maintenance/analytics. Finally, such measurements also do not accurately assign efficiency losses to the renewable source as a result of the energy storage round trip—that is, energy flow from the storage unit to the inverter and reverse flow from the inverter into the storage unit. This can be complicated by multiple factors such as, for example, (a) how often the battery is charged and discharged, (b) what depth of discharge is used to deliver to the AC load, (c) how the size of the renewable system (for example, the power generation capacity of solar panels) compare to the size of the storage system (for example, battery capacity/rating), and so on.

It is therefore desirable to obtain the production measurement for renewable energy in a storage-independent manner—in a form that would be comparable to renewable installations without storage. This is important for accurate billing, maintenance, and performance analytics. It is also desirable to be able to quantify efficiency losses arising from the use of a storage unit to estimate the actual impact of storage and, possibly, the charge controller algorithm on energy production.

As a solution, particular embodiments of the present disclosure provide for methods to separate out energy storage from the renewable generation and also provide for performance analytics metrics on both—energy storage and energy generation—separately. Furthermore, certain embodiments of the present disclosure also describe methods to separate out energy storage efficiency as a metric and to calculate it in different types of systems with different data availability constraints. A monitoring unit as per teachings of the present disclosure uses device communication and metering to enable revenue-grade production measurement for renewable source and energy storage periodically at specified time intervals such as, for example, every 5 minutes or every 15 minutes. In the discussion here, the term "renewable source" may be used interchangeably with the term "renewable" to refer to different types of renewable energy. The production measurement for a renewable source is obtained in a form that would be comparable to renewable installations without storage, which is important for accurate billing, maintenance, and performance analytics. Additionally, in particular embodiments, multiple energy flows may be used by the monitoring unit to arrive at an efficiency ratio that can be attributed to the storage unit in the renewable energy system. This efficiency ratio can be used to de-rate expected AC energy from the renewable generation system to compare with AC energy obtained in other systems—with or without storage, or to separate the efficiency of the energy source (for example, solar panel array) from the battery efficiency in combined solar-battery systems.

In one embodiment, the present disclosure is directed to a method for measuring production of renewable energy in a storage-independent manner in a renewable energy system. The method comprises: (i) determining each of the following values during a pre-determined time interval: (a) an "S" value, wherein the S value is an interval-specific magnitude of a first Direct Current (DC) energy flow from a renewable energy source to an intermediate unit in the system, (b) an "M" value, wherein the M value is an interval-specific magnitude of an Alternating Current (AC) energy flow between the intermediate unit and an AC interconnect point in the system, and (c) a "B" value, wherein the B value is an interval-specific magnitude of a second DC energy flow between the intermediate unit and a DC storage unit in the system; and (ii) using the S, M, and B values to calculate a portion of the interval-specific AC energy flow attributable only to the interval-specific first DC energy flow, thereby excluding contribution to the AC energy flow from the DC storage unit. In some embodiments, the intermediate unit may include an inverter and a charge controller.

In one embodiment, the method includes generation of pricing for the interval-specific first DC energy flow (from the renewable energy source) based on the calculated portion of the interval-specific AC energy flow.

In certain embodiments, the renewable energy is solar energy, and the renewable energy system is a PV solar system.

In the method, the portion of the interval-specific AC energy flow attributable only to the interval-specific first DC energy flow may be one of the following: (i) a first ratio calculated as M*S/(S+B) when the renewable energy source is net generating, the DC storage unit is net discharging, and net AC energy flow from the intermediate unit to the AC interconnect point is positive; and (ii) a second ratio calculated as M*S/(S−B) when the renewable energy source is net generating, the DC storage unit is net charging, and net AC energy flow from the intermediate unit to the AC interconnect point is positive.

In the method according to one embodiment, the portion of the interval-specific AC energy flow attributable only to the interval-specific first DC energy flow may be a ratio calculated as M*S*E/(B−S) when the renewable energy source is net generating, the DC storage unit is net charging, and net AC energy flow from the intermediate unit to the AC interconnect point is negative, wherein "E" is a round-trip efficiency factor for the inverter.

In particular embodiments, the method comprises: (i) estimating an efficiency factor for the inverter using the S, M, and B values; and (ii) multiplying the efficiency factor with the S value to calculate the portion of the interval-specific AC energy flow.

In certain embodiments, the method further comprises: (i) determining the following when the inverter is inoperable to charge the DC storage unit using AC energy from the AC interconnect point: (a) a sum of S values, wherein each S value in the sum is associated with a corresponding one of a plurality of pre-determined time intervals, and (b) a sum of M values, wherein each M value in the sum is associated with a corresponding one of the plurality of pre-determined time intervals; and (ii) calculating overall efficiency of the DC storage unit and operation thereof using the sum of S values, the sum of M values, and an efficiency factor for the inverter.

On the other hand, when the inverter is operable to charge the DC storage unit using AC energy from the AC interconnect point in an embodiment, the method comprises: (i) determining the following: (a) a sum of S values, wherein each S value in the sum is associated with a corresponding one of a plurality of pre-determined time intervals, (b) a sum of $M_{out}$ values, wherein each $M_{out}$ value is associated with a corresponding one of the plurality of pre-determined time intervals, and wherein each $M_{out}$ value is an interval-specific magnitude of the AC energy flow from the inverter into the AC interconnect point, and (c) a sum of $M_{in}$ values, wherein each $M_{in}$ value is associated with a corresponding one of the plurality of pre-determined time intervals, and wherein each $M_{in}$ value is an interval-specific magnitude of the AC energy flow from the AC interconnect point into the inverter; and (ii) calculating overall efficiency of the DC storage unit and operation thereof using the sum of S values, the sum of $M_{out}$ values, the sum of $M_{in}$ values, a DC-to-AC conversion efficiency factor for the inverter, and an AC-to-DC conversion efficiency factor for the inverter.

In one embodiment, the present disclosure is directed to a monitoring unit for measuring production of renewable energy in a storage-independent manner in a renewable energy system. The monitoring unit is operable to perform the following: (i) determine each of the following values during a pre-determined time interval: (a) an "S" value, wherein the S value is an interval-specific magnitude of a first DC energy flow from a renewable energy source to an intermediate unit in the system, (b) an "M" value, wherein the M value is an interval-specific magnitude of an AC energy flow between the intermediate unit and an AC interconnect point in the system, and (c) a "B" value, wherein the B value is an interval-specific magnitude of a second DC energy flow between the intermediate unit and a DC storage unit in the system; (ii) use the S, M, and B values to calculate a portion of the interval-specific AC energy flow attributable only to the interval-specific first DC energy flow, thereby excluding contribution to the AC energy flow from the DC storage unit; and (iii) generate pricing for the interval-specific first DC energy flow based on the calculated portion of the interval-specific AC energy flow.

In particular embodiments, the monitoring unit may be operable to perform various tasks, operations, and method steps described above, but not repeated here for the sake of brevity. Additionally, the monitoring unit may be operable to further perform the following: (i) when an inverter in the intermediate unit is inoperable to charge the DC storage unit using AC energy from the AC interconnect point, calculate overall efficiency of the DC storage unit and operation thereof using a first plurality of S values associated with a first plurality of time intervals, a first plurality of M values associated with the first plurality of time intervals, and an efficiency factor for the inverter; and (ii) when the inverter is operable to charge the DC storage unit using AC energy from the AC interconnect point, calculate the overall efficiency of the DC storage unit and operation thereof using a second plurality of S values associated with a second plurality of time intervals, a second plurality of M values associated with the second plurality of time intervals, a DC-to-AC conversion efficiency factor for the inverter, and an AC-to-DC conversion efficiency factor for the inverter.

In one embodiment, the present disclosure is directed to a data storage medium operable with a monitoring unit in a renewable energy system. The data storage medium may contain program instructions, which, when executed by the monitoring unit, cause the monitoring unit to perform the following: (i) determine each of the following values during a pre-determined time interval: (a) an "S" value, wherein the S value is an interval-specific magnitude of a first DC energy flow from a renewable energy source to an intermediate unit in the system, (b) an "M" value, wherein the M value is an interval-specific magnitude of an AC energy flow between the intermediate unit and an AC interconnect point in the system, and (c) a "B" value, wherein the B value is an interval-specific magnitude of a second DC energy flow between the intermediate unit and a DC storage unit in the system; and (ii) use the S, M, and B values to calculate a portion of the interval-specific AC energy flow attributable only to the interval-specific first DC energy flow, thereby measuring production of renewable energy by the renewable energy source in a storage-independent manner.

In certain embodiments, the program instructions, upon execution by the monitoring unit, may cause the monitoring unit to perform various tasks, operations, and method steps described above, but not repeated here for the sake of brevity.

In one embodiment, the present disclosure is directed to a method for measuring overall efficiency of a DC storage unit and operation thereof in a renewable energy system. The method comprises: (i) determining a sum of "S" values, wherein each S value in the sum is associated with a corresponding one of a plurality of pre-determined time intervals and is an interval-specific magnitude of a DC energy flow from a renewable energy source to an inverter in the system, and wherein the DC storage unit is operatively connected to the inverter and configured to store DC energy; (ii) further determining a sum of "M" values, wherein each M value in the sum is associated with a corresponding one of the plurality of pre-determined time intervals and is an interval-specific magnitude of an AC energy flow between the inverter and an AC interconnect point in the system; and (iii) using the sum of S values, the sum of M values, and an efficiency factor for the inverter to calculate the overall efficiency of the DC storage unit and operation thereof.

Thus, as per teachings of the present disclosure, the time interval-based production measurement for a renewable source is obtained in a form that would be comparable to renewable installations without storage. By making the measurement metrics directly comparable, system owners can measure and manage their renewable assets in ways currently used by the market for optimization, financing, and securitization. These activities are critical to the continued growth of the renewable energy market, and while energy storage is a key new capability, it may be difficult without the methodologies of the present disclosure to use the established processes to develop the projects, find off-takers for the energy product, and efficiently manage the renewable assets. Furthermore, the present disclosure also provides a methodology to estimate the actual impact of storage and the charge controller algorithm on AC energy production. This estimation may be more useful for assessing system performance than the roundtrip energy storage efficiency metric alone. As is understood, the roundtrip storage efficiency number expresses the efficiency of putting a unit of energy into storage and getting it back. However, not all energy may pass through the storage in some renewable source systems. In other systems, all renewable energy plus additional energy from the AC grid may pass through the storage. The overall storage efficiency metric expressed in the present disclosure addresses this additional complexity and gives a single number that can be used to explain the impact of the presence of storage and the charge control strategy on renewable energy production.

BRIEF DESCRIPTION OF THE DRAWINGS

In the following section, the present disclosure will be described with reference to exemplary embodiments illustrated in the figures, in which.

DETAILED DESCRIPTION

In the following detailed description, numerous specific details are set forth in order to provide a thorough understanding of the disclosure. However, it will be understood by those skilled in the art that the present disclosure may be practiced without these specific details. In other instances, well-known methods, procedures, components and circuits have not been described in detail so as not to obscure the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" or "according to one embodiment" (or other phrases having similar import) in various places throughout this specification are not necessarily all referring to the same embodiment. Furthermore, the particular features, structures, or characteristics may be combined in any suitable manner in one or more embodiments. Also, depending on the context of discussion herein, a singular term may include its plural forms and a plural term may include its singular form. Similarly, a hyphenated term (e.g., "pre-determined," "interval-specific", "on-site," etc.) may be occasionally interchangeably used with its non-hyphenated version (e.g., "predetermined," "interval specific", "on site," etc.), and a capitalized entry (e.g., "Charge Controller," "Battery Unit," etc.) may be interchangeably used with its non-capitalized version (e.g., "charge controller," "battery unit," etc.). Such occasional interchangeable uses shall not be considered inconsistent with each other.

It is noted at the outset that the terms "coupled," "operatively coupled," "connected", "connecting," "electrically connected," etc., are used interchangeably herein to generally refer to the condition of being electrically/electronically connected in an operative manner. Similarly, a first entity is considered to be in "communication" with a second entity (or entities) when the first entity electrically sends and/or receives (whether through wireline or wireless means) information signals (whether containing address, data, or control information) to/from the second entity regardless of the type (analog or digital) of those signals. It is further noted that various figures shown and discussed herein are for illustrative purpose only, and are not drawn to scale.

The terms "first," "second," etc., as used herein, are used as labels for nouns that they precede, and do not imply any type of ordering (e.g., spatial, temporal, logical, etc.) unless explicitly defined as such.

Figure 2:
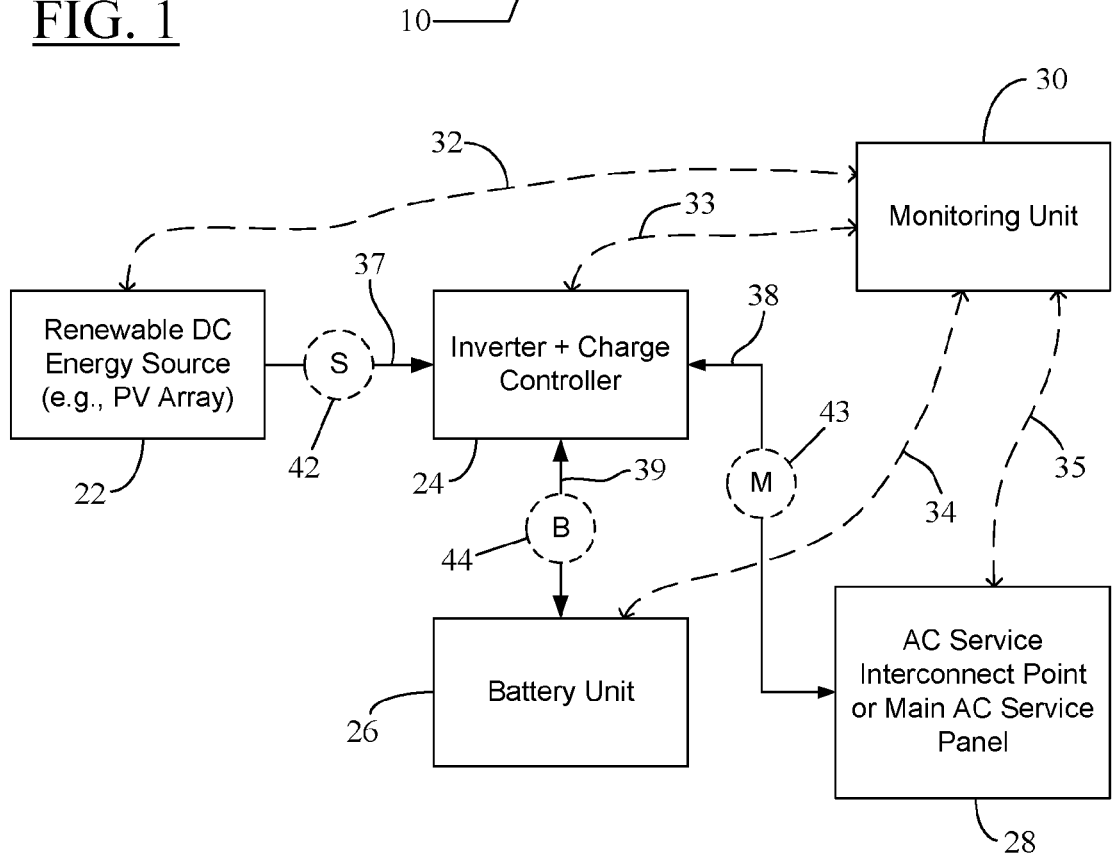
FIG. 2 is a simplified block diagram of an exemplary renewable energy system according to one embodiment of the present disclosure showing various energy flows to be measured on a per-interval basis as per teachings of the present disclosure for calculations of renewable source production and system storage efficiency.

FIG. 2 is a simplified block diagram of an exemplary renewable energy system 20 according to one embodiment of the present disclosure showing various energy flows to be measured on a per-interval basis as per teachings of the present disclosure for calculations of renewable source production and system storage efficiency. The renewable energy system 20 may be a PV solar system and, hence, the discussion below may occasionally refer to solar energy and PV solar system instead of the corresponding general terms "renewable energy" and "renewable energy system." As shown, the system 20 may include a renewable DC energy source 22, an inverter unit 24, a storage (battery) unit 26, an AC service interconnect point (or AC main service panel) 28, and a monitoring unit 30. An AC load (such as, for example, a residential electrical load if the system 20 is a residential system) or AC power grid (for example, if the system 20 is a commercial system) may receive the AC energy through the AC interconnect point 28. In one embodiment, the renewable energy source 22 may be an array of PV solar panels.

Figure 1:
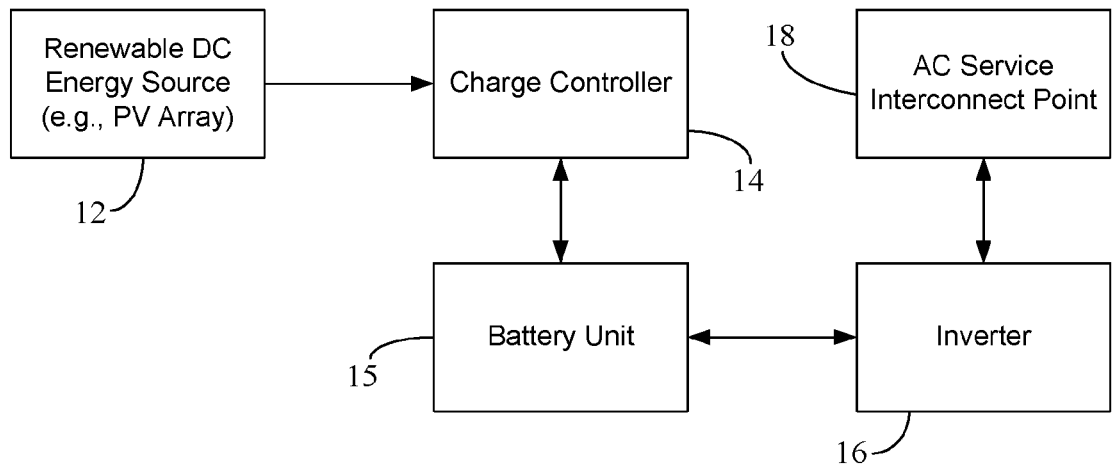
FIG. 1 is a simplified block diagram of an exemplary renewable energy system with on-site energy storage.

For simplicity and ease of analysis as per teachings of present disclosure, an inverter, like the inverter 16 in FIG. 1 or a similar unit(s) having the inverter functionality of converting DC to AC, and a charge controller, like the charge controller 14 in FIG. 1, are considered as a combined entity in the form of the inverter unit 24 in FIG. 2. In the discussion below, any energy flow between these two individual entities will be ignored. Furthermore, although the inverter unit 24 may be occasionally referred to simply as an "inverter" in the discussion below because of the relevance of its inverter functionality, it is understood that the inverter unit 24 includes charge controller functionality as well. However, unless the context requires otherwise (for example, when the DC energy flow from the source 22 is discussed, the charge controller functionality may be more relevant), the mention of the inverter unit 24 in the discussion below is primarily with reference to its inverter functionality. For example, the later discussion of energy flow between the inverter unit 24 and the AC interconnect point 28 refers to the energy flow between the inverter (not shown) within the inverter unit 24 and the AC interconnect point 28. Similarly, the discussion of inverter efficiency should be construed to refer to the efficiency of the inverter portion within the inverter unit 24, and not to include the efficiency of the charge controller portion. Although, for the sake of brevity, the inverter within the inverter unit 24 may not be mentioned every time inverter functionality is discussed with reference to the inverter unit 24, such reference may be implied from the context of discussion. Similarly, even if the general term "inverter unit" is mentioned without more, the functionality under discussion may apply to its charge controller portion only, as can be evident from the context of discussion.

It is noted here that the DC energy source 22 may be functionally substantially similar to the DC energy source 12 in FIG. 1, the inverter unit 24 may collectively provide substantially similar functionalities as are individually provided by the units 14, 16 in FIG. 1, the battery unit 26 may be functionally substantially similar to the battery unit 15 in FIG. 1, and the AC interconnect point 28 may be functionally substantially similar to the AC interconnect point 18 in FIG. 1. Therefore, the earlier discussion of various constituent units in FIG. 1 applies to similar units in FIG. 2 and is not repeated here for the sake of brevity. It is noted, however, that the system units 22, 24, 26, and 28 in the renewable energy system 20 in the embodiment of FIG. 2 are different from similar units in FIG. 1 in the sense that the units in FIG. 2 are configured to be operatively connected with the monitoring unit 30 as shown by respective dotted arrows 32-35. One or more of these connections may be wired or wireless. In some embodiments, the monitoring unit 30 may be located off-site and may be in communication with the system units 22, 24, 26, and 28 via a communication network (not shown) such as, for example, an Internet Protocol (IP) based network like the Internet. As discussed below, in certain embodiments, energy flow metering may be integral to one or more of the system units 22, 24, 26, and 28, in which case the system unit(s) may periodically report relevant energy flow measurements to the monitoring unit 30 via its respective connection—direct or indirect (such as through a network).

Figure 3:
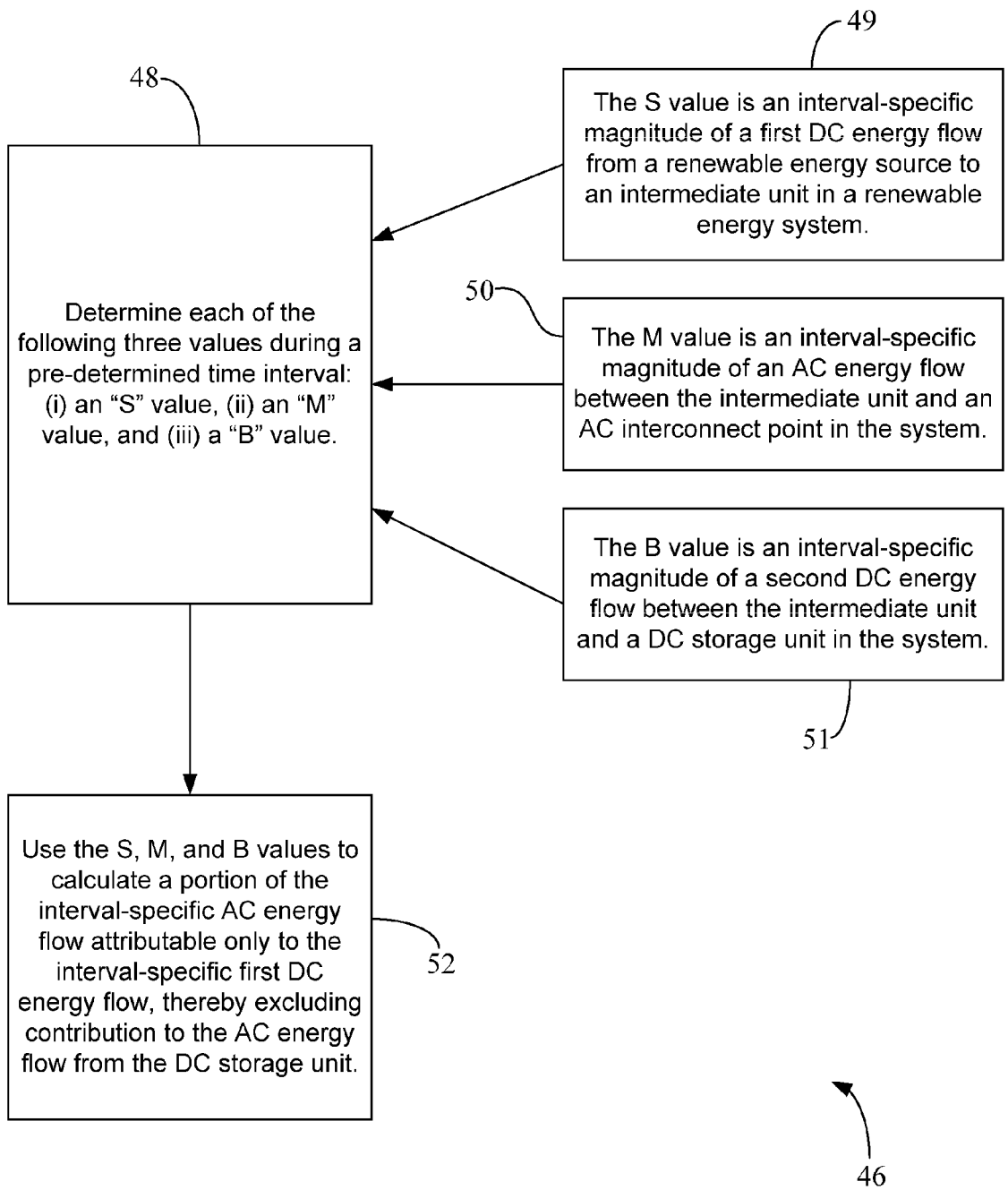
FIG. 3 shows an exemplary flowchart illustrating how renewable source production measurement may be performed in a storage-independent manner according to one embodiment of the present disclosure.
Figure 4:
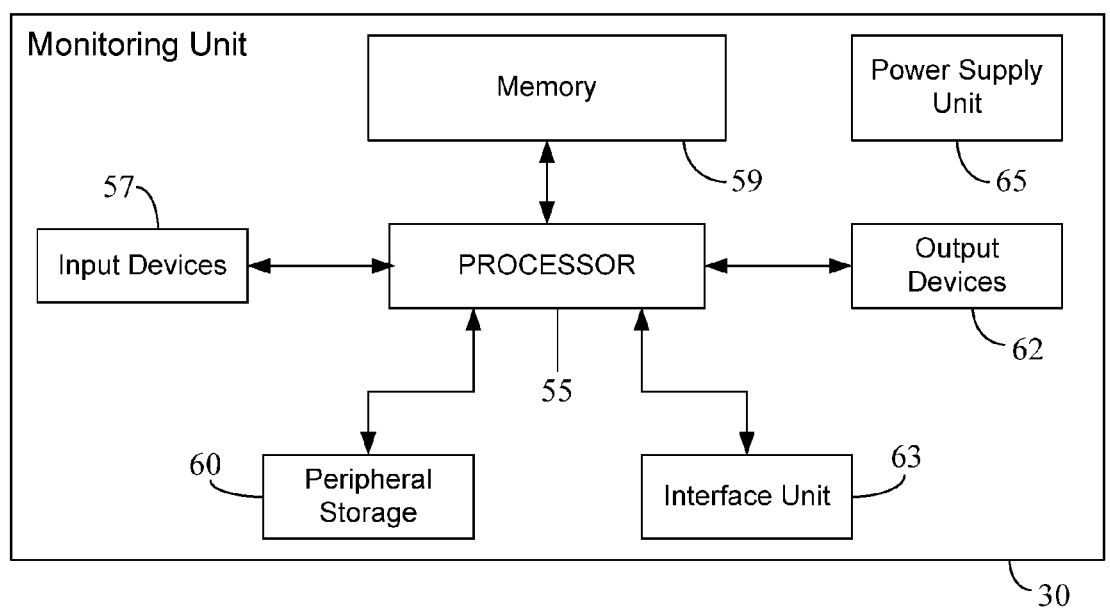
FIG. 4 depicts an exemplary block diagram of a monitoring unit according to one embodiment of the present disclosure.

Exemplary architectural details of a monitoring unit, such as the unit 30 in FIG. 2, are shown in FIG. 4, which is discussed later below. It is noted here that the monitoring unit 30 may be configured (in hardware, via software, or both) to implement some or all of the renewable source production measurement and storage efficiency determination aspects as per teachings of the present disclosure. For example, when existing hardware of the monitoring unit 30 cannot be modified, the production measurement and efficiency determination methodologies according to particular embodiments of the present disclosure may be implemented through suitable programming of one or more processors in the monitoring unit 30. Such processor(s) may be, for example, the processor 55 in FIG. 4. Upon execution of the program code by a processor in the monitoring unit 30, the monitoring unit 30 may be operative to perform various calculations discussed with reference to FIGS. 2-3. Thus, in the discussion herein, although the monitoring unit 30 may be referred to as "performing," "accomplishing," or "carrying out" a function or process, it is evident to one skilled in the art that such performance may be technically accomplished in hardware and/or software as desired.

As noted before, the monitoring unit 30 may be operatively coupled to the units 22, 24, 26, and 28 in the system 20 via a communication network (not shown) and may receive and store equipment-specific information therein for the units 22, 24, 26, and 28. In one embodiment, the monitoring unit 30 may wirelessly communicate with one or more of these units via the network. Such wireless communication may be carried out using a short-range wireless connectivity protocol such as, for example, the Bluetooth® standard, a Wireless Local Area Network (WLAN) based connection, a Near-Field Communication (NFC) protocol, a protocol that supports Machine-to-Machine (M2M) communication, and the like. In some embodiments, the system 20 may include more or less or different types of functional entities than those shown in FIG. 2.

In one embodiment, the network connecting the monitoring unit 30 with other units in the system 20 may be a packet-switched network such as, for example, an IP network like the Internet, a circuit-switched network, such as the Public Switched Telephone Network (PSTN), or a combination of packet-switched and circuit-switched networks. In another embodiment, the network may be an IP Multimedia Subsystem (IMS) based network, a satellite-based communication link, a Worldwide Interoperability for Microwave Access (WiMAX) system based on Institute of Electrical and Electronics Engineers (IEEE) standard IEEE 802.16e, an IP-based cellular network such as, for example, a Third Generation Partnership Project (3GPP) or 3GPP2 cellular network like a Long Term Evolution (LTE) network, a combination of cellular and non-cellular networks, a proprietary corporate network, a Public Land Mobile Network (PLMN), and the like.

In one embodiment, the monitoring unit 30 may be a back-end system containing a PV solar analytics database. The database in the monitoring unit 30 may be a proprietary data source owned, operated, or maintained by, for example, a PV solar site installation/maintenance company. In certain embodiments, the monitoring unit 30 may be an on-site monitoring unit that is in communication with various other on-site equipment—like the units 22, 24, and 26—and may receive and store equipment-specific information in a memory unit (like the memory 59 in FIG. 4) in the monitoring unit 30.

In particular embodiments, the physical structure of the monitoring unit 30 may include metering and/or communication ability to obtain information on all requisite kWh (kilo watt hour) energy flows in the system 20. In other words, as discussed in more detail below, the monitoring unit 30 may be able to receive energy flow-metering related information either from a dedicated, flow-specific meter or through communication with the relevant unit 22, 24, 26, 28 having an integral capability to meter and report the respective energy flow itself. More specifically, in particular embodiments, the present disclosure may include the measurement and reporting of one or more of the following energy flows:

1. Renewable energy flow into the inverter unit 24 (in one embodiment, the charge controller portion of the unit 24), the kWh flow information about which may be obtained by the monitoring unit 30 in one of the following ways:

(a) Through DC sub-metering on the DC renewable source(s). A dedicated DC sub-metering equipment (not shown) may be installed to measure the DC energy flow between the energy source 22 and the inverter unit 24. The installed equipment may be operatively connected—through wired or wireless means—to the monitoring unit 30 and configured to report the measured flow to the monitoring unit 30 automatically as required per teachings of the present disclosure or in response to each request from the monitoring unit 30.

(b) Through communication with the integrated DC inverter/charge controller unit 24, which may be configured to meter the incoming energy flow and provide the information on energy flow from the renewable source into the inverter portion and the charge controller portion separately, or the total integrated flow received from the energy source 22. In one embodiment, the inverter unit 24 may provide the requisite flow information automatically as required per teachings of the present disclosure, or in response to each request from the monitoring unit 30.

2. Flow to/from the inverter unit 24 from/to the battery unit 26. This flow may be reported as a net accumulated flow or disaggregated (directional) flow numbers in each direction—input to the battery unit 26 and output from the battery unit 26. The kWh flow information about this flow may be obtained by the monitoring unit 30 in one of the following ways:

(a) As reported by the battery unit 26. The battery unit 26 may be configured to report the incoming and outgoing flow numbers for the energy flow to/from the inverter unit 24 to the monitoring unit 30 automatically as required per teachings of the present disclosure or in response to each request from the monitoring unit 30.

(b) As reported by the charge controller (when it is not integrated with an inverter). The charge controller may be configured to report the incoming and outgoing flow numbers for the energy flow to/from the battery unit 26 to the monitoring unit 30 automatically as required per teachings of the present disclosure or in response to each request from the monitoring unit 30.

(c) As reported by the integrated inverter/CC unit 24. The integrated inverter/CC unit 24 may be configured to report the incoming and outgoing flow numbers for the energy flow to/from the battery 26 to the monitoring unit 30 automatically as required per teachings of the present disclosure or in response to each request from the monitoring unit 30.

(d) Through DC sub-metering at the battery unit 26. A dedicated DC sub-metering equipment (not shown) may be installed at the battery unit 26 to measure the DC energy flow between the battery unit 26 and the inverter unit 24. The installed equipment may be operatively connected—through wired or wireless means—to the monitoring unit 30 and configured to report the measured flow to the monitoring unit 30 automatically as required per teachings of the present disclosure or in response to each request from the monitoring unit 30.

3. Flow to/from the inverter (when it is not integrated with a charge controller) from/to the AC main service panel/interconnect point 28. This flow may be reported as a net accumulated flow or disaggregated (directional) flow numbers in each direction—input to the inverter and output from the inverter. The kWh flow information about this flow may be obtained by the monitoring unit 30 in one of the following ways:

(a) Through an AC watt-hour meter (not shown) installed at the AC mains panel 28 to measure the energy flow between the inverter and the AC mains panel 28. The AC watt-hour meter may be operatively connected—through wired or wireless means—to the monitoring unit 30 and configured to report the measured flow to the monitoring unit 30 automatically as required per teachings of the present disclosure or in response to each request from the monitoring unit 30. Alternatively, in one embodiment, the AC mains panel 28 (with in-built watt-hour meter) may be configured to communicate the relevant energy flow information to the monitoring unit 30.

(b) As reported by the inverter. The inverter may be configured to report the incoming and outgoing flow numbers—for the energy flow to/from the AC mains panel 28—to the monitoring unit 30 automatically as required per teachings of the present disclosure or in response to each request from the monitoring unit 30.

4. Net kWh outflow from the battery 26 and net kWh inflow into the battery 26. The kWh information about these flows may be obtained by the monitoring unit 30 in one of the following ways:

(a) Through DC sub-metering at the battery unit 26. A dedicated DC sub-metering equipment (not shown) may be installed at the battery unit 26 to measure the DC energy flow to/from the battery unit 26. The installed equipment may be operatively connected—through wired or wireless means—to the monitoring unit 30 and configured to report the measured flow to the monitoring unit 30 automatically as required per teachings of the present disclosure or in response to each request from the monitoring unit 30.

(b) As reported by the battery unit 26. The battery unit 26 may be configured to report the incoming and outgoing flow numbers for the energy flow to/from the battery unit 26 to the monitoring unit 30 automatically as required per teachings of the present disclosure or in response to each request from the monitoring unit 30.

(c) As reported by the charge controller, if it is not integrated with the inverter. The charge controller may be configured to report the incoming and outgoing flow numbers for the energy flow to/from the battery 26 to the monitoring unit 30 automatically as required per teachings of the present disclosure or in response to each request from the monitoring unit 30.

(d) As reported by the integrated inverter/CC unit 24. The integrated inverter/CC unit 24 may be configured to report the incoming and outgoing flow numbers for the energy flow to/from the battery 26 to the monitoring unit 30 automatically as required per teachings of the present disclosure or in response to each request from the monitoring unit 30.

5. Charge state of the battery 26. The information about the charge state of the battery 26 may be obtained by the monitoring unit 30 in one of the following ways:

(a) As reported by the battery unit 26. The battery unit 26 may be configured to report its charge state to the monitoring unit 30 automatically as required per teachings of the present disclosure or in response to each request from the monitoring unit 30.

(b) As reported by a monitoring equipment (not shown) connected to the battery 26. The monitoring equipment may be operatively connected to the monitoring unit 30—through wired or wireless means—and configured to report the battery charge state to the monitoring unit 30 automatically as required per teachings of the present disclosure or in response to each request from the monitoring unit 30.

Because the inverter and charge controller are treated as a combined entity 24 in the present disclosure and because any energy flows between them are ignored, it is observed that, more generally, there may be three overall energy flows in the system 20 relevant to the present disclosure: (i) the unidirectional energy flow from the renewable source 22 (for example, solar panels) to the inverter/charge controller (CC) unit 24 as represented by the exemplary arrow 37 in FIG. 2, (ii) the bi-directional energy flow to/from the inverter/CC unit 24 from/to the main AC service panel 28 as represented by the exemplary arrow 38 in FIG. 2, and (iii) the bi-directional energy flow to/from the inverter/CC unit 24 from/to the battery unit 26 as represented by the exemplary arrow 39 in FIG. 2.

The discussion below now addresses in detail two aspects of the present disclosure: (i) production measurement of renewable source in a storage-independent manner, and (ii) calculation of the system storage efficiency.

Renewable source Production Measurement during a Set Interval. As mentioned before, energy flow information may be conveyed to the monitoring unit 30 either by installing dedicated AC or DC sub-metering equipment or through metering and information-sharing features built into the units 22, 24, 26, and 28 in the system 20. In one embodiment, the monitoring unit 30 may take "snapshots" of the net energy flows at arrows 37-39 at a pre-determined interval such as, for example, every 5 minutes or every 15 minutes. The values associated with each snapshot may be stored in the monitoring unit 30 for further processing as per teachings of the present disclosure. The snapshot interval may be set through software programming of the monitoring unit 30. In certain embodiments, the flow-reporting equipment (like a sub-meter) or unit 22, 24, 26, 28 may be configured to measure and report the related flow information to the monitoring unit 30 at the set interval. Alternatively, the monitoring unit 30 itself may query each equipment/unit periodically—at the set interval—for the measured flow value. In any event, for every flow-measurement period, the delta (or difference) between the current and previous snapshots may be calculated by the monitoring unit 30 to be used as interval-specific energy flows.

FIG. 3 shows an exemplary flowchart 46 illustrating how renewable source production measurement may be performed in a storage-independent manner according to one embodiment of the present disclosure. In particular embodiments, various tasks illustrated in FIG. 3 may be performed by the monitoring unit 30 (FIG. 2). Thus, as noted at block 48 in FIG. 3, the monitoring unit 30 may determine each of the following three values during a pre-determined time interval: (i) an "S" value, which is the interval-specific magnitude of a first DC energy flow from the renewable energy source 22 to an intermediate unit, such as the inverter unit 24 (or, in one embodiment, the charge controller portion of the inverter unit 24), in the renewable energy system 20 as noted at block 49; (ii) an "M" value, which is the interval-specific magnitude of the AC energy flow between the inverter unit 24 (or, in one embodiment, the inverter portion of the inverter unit 24) and an AC interconnect point 28 in the system 20 as noted at block 50; and (iii) a "B" value (block 51), which is the interval-specific magnitude of a second DC energy flow between the inverter unit 24 (or, in one embodiment, the inverter portion of the inverter unit 24) and the DC storage unit 26 in the system 20 as noted at block 51. Just for the sake of illustration, each of these S, M, and B values is shown in FIG. 2 as a dotted, circled letter 42-44 placed over the respective energy flow-indicating arrow 37-39 to indicate the interval-based measurement and analysis of the associated energy flow as per teachings of the present disclosure.

Furthermore, as discussed in more detail below and as noted at block 52 in FIG. 3, the monitoring unit 30 may use the S, M, and B values to calculate a portion of the interval-specific AC energy flow attributable only to the interval-specific first DC energy flow from the renewable energy source 22, thereby excluding contribution to the AC energy flow from the DC storage unit 26. In certain embodiments, the monitoring unit 30 also may generate pricing for the interval-specific DC energy flow from the renewable energy source 22 in a storage-independent manner—that is, based on the calculated portion of the interval-specific AC energy flow.

The following energy flow scenarios during a pre-determined measurement time interval may dictate how the monitoring unit 30 uses the S, M, and B values to determine the interval-specific AC energy flow in a storage-independent manner:

1. During the measurement time interval, it may be possible that the energy source 22 is net generating the renewable energy, the battery unit 26 is net discharging, and the net energy flow from the inverter unit 24 to the AC main service panel 28 is positive. In this case, the AC energy from the inverter unit 24 results from a sum of S+B, so the monitoring unit 30 may need to allocate a portion of the AC energy to "S." Thus, in this case, the monitoring unit 30 may calculate (or determine) the interval-specific AC energy attributed only to the renewable source—that is, the DC energy flow from the renewable energy source 22—as the ratio M*S/(S+B).

2. During the measurement time interval, it may be possible that the energy source 22 is net generating the renewable energy, the battery unit 26 is net charging, and the net energy flow from the inverter unit 24 to the AC main service panel 28 is positive. In this case, the AC energy from the inverter unit 24 results from (S−B), so the monitoring unit 30 may calculate (or determine) the interval-specific AC energy attributed only to the renewable source as the ratio M*S/(S−B).

3. During the measurement time interval, it may be possible that the energy source 22 is net generating the renewable energy, the battery unit 26 is net charging, and the net energy flow from the inverter unit 24 to the AC main service panel 28 is negative. In this case, the battery charge operation is consuming more energy than the solar panel (energy source) 22 is able to provide and, hence, the inverter may be drawing energy from the AC grid/service point 28 to charge the battery. Thus, the AC energy flow is now resulting from (B−S) and is negative, whereas the actual AC flow could have resulted from "S" and would have been positive had the inverter not been drawing energy from the AC grid. However, it is observed that, in this case, the inverter unit 24 is net converting AC energy to DC. Therefore, the ratio of M to (B−S) may not be a good multiplier to convert the actual renewable energy (such as the solar energy) to what the expected AC output would have been. Hence, in this case, the monitoring unit 30 may multiply the calculation with an inverter roundtrip efficiency factor for the inverter unit 24 to account for the negative AC energy flow. (The discussion below addresses how to determine the inverter efficiency.) Consequently, the monitoring unit 30 may calculate the magnitude of the interval-specific AC energy attributed only to the renewable energy (such as the solar energy) as the ratio $M*Eff_I*S/(B-S)$, where "$Eff_I$" is the inverter roundtrip efficiency factor. It is noted here that, in some embodiments, the term "$Eff_I$" may indicate a product of the parameters "$Eff_{IAC-DC}$" and "$Eff_{IDC-AC}$" discussed later below.

4. During the measurement time interval, it may be possible that the energy source 22 is net generating the renewable energy, but the battery unit 26 is idle. In this case, the monitoring unit 30 may directly attribute all of the interval-specific AC energy to the interval-specific renewable energy without any calculations.

5. During the measurement time interval, it may be possible that the energy source 22 is not generating the renewable energy; the battery unit 26 may be idle or charging or discharging. In a PV solar system like that shown in FIG. 1, there is usually some standby inverter consumption, which can be allocated to solar (renewable source). However, in an integrated system like that shown in FIG. 2, it may not be possible to allocate part of any energy consumption by the inverter unit 24 in such a situation to a renewable source. Hence, in this case, the monitoring unit 30 may not allocate any AC energy flow (from the inverter unit 24) to the renewable energy when the source is not generating.

In one embodiment, an equivalent comparable AC energy reading for a PV solar system, such as the system 20 in FIG. 2, from an interval-specific DC solar energy may be obtained by the monitoring unit 30 by directly multiplying the DC interval energy with an efficiency value ($Eff_I$) for the inverter (not shown) in the inverter unit 24.

In certain embodiments, the inverter efficiency ($Eff_I$) may be determined or estimated using one of the following two methods:

1. The inverter efficiency curves are well-documented. A nominal efficiency value—which may be referred to as "$Eff_I$"—can be selected from such curves to represent the average operational region of the inverter unit 24 in the renewable energy system 20. The monitoring unit 30 may be programmed with this efficiency value ($Eff_I$).

2. In one embodiment, the inverter efficiency value ($Eff_I$) may be estimated using a set of S, M, and B values. For example, if the system 20 has the ability to monitor the in/out flow of energy to/from the battery unit 26 at any given time, the monitoring unit 30 can estimate inverter efficiency ($Eff_I$) by dividing the observed total AC output (from the inverter unit 24) by the observed total DC input (to the inverter unit 24) from the renewable source (that is, from the DC energy source 22) during a time interval when the net battery flow is zero. Thus, the inverter efficiency may be given by $Eff_I=M/S$ (when B=0).

By performing the calculations discussed above-starting with the discussion of FIG. 3—and recording representative renewable DC energy generation in AC output terms during a set interval, certain data may be generated by the monitoring unit 30. In one embodiment, this data may be used, for example, by the monitoring unit 30, for accurate stand-alone DC energy (for example, solar) billing, independent of storage. In another embodiment, this data also may be used by the monitoring unit 30 to create analytics of system operations and performance. These aspects are elaborated in more detail below:

1. Standalone Solar Billing: A system may be configured and sold as a solar system by provider A on a Power Purchase Agreement (PPA). This system also may be coupled to an energy storage system by provider B. In case of such a storage-based PV solar system, the generated DC solar energy may get split between the fraction that gets diverted to energy storage to charge batteries and the rest which would flow to the AC grid/load. In this system, billing based on DC alone may be incorrect because it would exclude inverter efficiency. On the other hand, billing based on net AC would also be incorrect because it would exclude storage operations. However, an interval-based calculation of solar (DC) energy in AC terms as discussed before in the context of the embodiments in FIGS. 2 and 3 "links" the DC source with the AC part of the system and may serve as an appropriate data for billing because it captures what the PV solar system would have delivered to the AC side in the absence of storage. This may be especially important when energy prices vary based on Time of Use (TOU) pricing, and knowing accurate time interval data—such as, for example, the interval-specific S, M, and B values discussed before—may impact the contracted energy prices in the PPA.

2. Operations and Maintenance (O&M): Some O&M activities in a PV solar system may rely on time interval data obtained as per teachings of the present disclosure to diagnose gradual declines in performance—such as, for example, increases in shading and/or soiling of a PV panel—versus equipment outages. The interval-specific S, M, and B values generated as discussed before may enable this type of O&M activity in the system.

3. Performance Analytics: One possible form of performance analytics of a PV solar system may use time interval data of solar irradiance as input and model the expected AC output to actual observed AC output. The DC output from the PV panels may not be comparable to the AC output measurements obtained from a PV-only system (which is a PV solar system without storage), and may also miss out on some of the modeled causes of degraded performance such as, for example, inverter clipping (of AC output). On the other hand, the interval-based data measurements discussed above may offer a good substitute to overcome these limitations.

Deriving System Storage Efficiency. The roundtrip storage efficiency number may express the efficiency of putting a unit of energy into storage and then getting it back. However, system storage efficiency in a renewable energy system with storage may not simply be the roundtrip efficiency of energy storage; it may be a measure of what percentage of energy that could have made it out to useful form if the system did not have storage, actually did so in the presence of storage. For example, if a 5 kW PV system without storage generated 600 kWh of AC energy is compared with a first identical system with storage that charged and discharged the batteries everyday delivered 480 kWh of AC energy, and with a second identical system with storage that charged and discharged the batteries weekly delivered 540 kWh of AC energy (in both the first and the second systems, it is assumed that the charge state of the battery at the end of the month is identical to that at the beginning of the month), the storage efficiency of the first system is 80% and that of the second system is 90%.

In determining system storage efficiency as per particular embodiments of the present disclosure, two variables of the combination of renewable and storage system may be considered. The first variable is whether the inverter unit 24 allows charging of the energy storage system 26 from the AC grid (via the AC interconnect point 28)—that is, whether the inverter (in the inverter unit 24) converts AC to DC for the express purpose of charging the batteries in the storage unit 26. The second variable is whether the available energy flow data in the renewable energy system 20 includes disaggregated (directional) flows in each direction for energy flow into and out of the battery and between the grid and the inverter (in the unit 24).

In the discussion below, the terms like "storage efficiency", "system storage efficiency," and "energy system storage efficiency" are used interchangeably to refer to the overall efficiency of the storage unit 26 and its operation. In other words, the storage efficiency derived below is more than the efficiency of simply the storage unit 26; the storage efficiency reflects the efficiency of the storage unit 26 as well as how it is operated because the strategy of how the storage unit 26 is used also affects the operational efficiency of the system 20.

Case 1: Inverter Cannot Charge Energy Storage from Grid Power (that is, No AC to DC Conversion). In this case, although the DC renewable energy from the source 22 may go into the battery 26 (via the inverter unit 24), eventually the sum of all outflows (M) from the inverter unit 24 may have their original source in the sum of all inflows (S) from the renewable source 22. Therefore, to determine the overall efficiency of the energy storage system 26 that can be attributed to the round-trip battery transfers (that is, energy flow to and from the battery, including multiple times), it may be preferable to isolate and remove the impact of inverter efficiency. As discussed before, in certain embodiments, the inverter efficiency ($Eff_I$) may be determined or estimated using one of the following two methods:

1. The inverter efficiency curves are well-documented. A nominal efficiency value—which may be referred to as "$Eff_I$"—can be selected from such curves to represent the average operational region of the inverter (not shown) in the inverter unit 24 in the renewable energy system 20. The monitoring unit 30 may be programmed with this efficiency value ($Eff_I$).

2. In one embodiment, the inverter efficiency value ($Eff_I$) may be estimated using a set of S, M, and B values. For example, if the system 20 has the ability to monitor the in/out flow of energy to/from the battery unit 26 at any given time, the monitoring unit 30 can estimate inverter efficiency ($Eff_I$) by dividing the observed AC output (from the inverter unit 24) by the observed DC input (to the inverter unit 24) from the renewable source (that is, from the DC energy source 22) during a time interval when the net battery flow is zero. Thus, the inverter efficiency may be given by $Eff_I=M/S$ (when B=0).

In this case under consideration, the relationship between M and S over a long term may be given by:

$$\text{Sum}(M)=\text{Sum}(S)*(\text{storage efficiency})*(Eff_I)+(\text{change in stored battery energy})*(Eff_I) \quad (1)$$

In the equation (1) above, the parameter "Sum(M)" refers to the sum of a plurality of M values, each M value being associated with a corresponding measurement time interval as discussed before. Similarly, the parameter "Sum(S)" refers to the sum of a plurality of S values determined over a corresponding plurality of measurement intervals. Furthermore, it is noted that the parameter referred to as "change in stored battery energy" in equation (1) should be multiplied with the battery's discharging efficiency if the parameter is negative and divided by the battery's charging efficiency if the parameter is positive. However, these efficiencies are not mentioned in equation (1) above because the delta (difference) in the stored energy is negligible enough over a long period of time and charging and discharging efficiencies may be close enough to "1".

From equation (1), the overall storage efficiency—that is, efficiency of the system that can be attributed to battery storage, charge, and discharge cycles—can be given as:

$$\text{Storage efficiency}=(\text{Sum}(M)-(\text{change in stored battery energy})*Eff_I)/(\text{Sum}(S)*Eff_I) \quad (2)$$

In the equation (2) above, the known or estimated inverter efficiency ($Eff_I$) (as discussed before) can be substituted. Furthermore, when energy storage system efficiency in equation (2) is evaluated over a long period of time, such as, for example, over months or years, changes in energy storage level may become insignificant. In that case, equation (2) may be simplified to:

$$\text{Energy storage system efficiency} = \text{Sum}(M) / (\text{Sum}(S) * Eff_I) \qquad (3)$$

In particular embodiments, the monitoring unit 30 may be programmed to use the equation (3) above to determine overall efficiency of the energy storage unit 26 and how it is operated, and the impact of the storage efficiency for the system as a whole.

Case 2: Inverter can charge energy storage from grid power (that is, AC to DC conversion is present) and disaggregated (directional) flows for M are available. In this case, the term "$M_{out}$" (associated with a measurement interval) may be used to represent the interval-specific magnitude of the AC energy flow M from the inverter (not shown) in the inverter unit 24 into the AC interconnect point 28. Similarly, the term "$M_{in}$" (associated with the same or another measurement interval) may be used to represent the interval-specific magnitude of the AC energy flow M from the AC interconnect point 28 into the inverter in the inverter unit 24. Consequently, the relationship between M (which includes $M_{out}$ as well as $M_{in}$) and S over a long term may be given by:

$$\text{Sum}(M_{out}) = \text{Sum}(S)*(Eff_{IDC\text{-}AC})*(\text{storage efficiency}) + \text{Sum}(M_{in})*(Eff_{IAC\text{-}DC})*(Eff_{IDC\text{-}AC})*(\text{storage efficiency}) + (\text{change in stored battery energy})*(Eff_{IDC\text{-}AC}) \qquad (4)$$

In the equation (4) above, the parameter "$\text{Sum}(M_{out})$" refers to the sum of a plurality of $M_{out}$ values, each $M_{out}$ value being associated with a corresponding measurement time interval as discussed before. Similarly, the parameter "$\text{Sum}(M_{in})$" refers to the sum of a plurality of $M_{in}$ values, each $M_{in}$ value being associated with a corresponding measurement time interval as discussed before. In one embodiment, the same measurement interval may have both $M_{out}$ as well as $M_{in}$ values depending on the direction of the AC energy flow for M. The parameter "$\text{Sum}(S)$" refers to the sum of a plurality of S values determined over a corresponding plurality of measurement intervals. The parameters "$Eff_{IAC\text{-}DC}$" and "$Eff_{IDC\text{-}AC}$" in equation (4) are discussed later below. Furthermore, it is noted that the parameter referred to as "change in stored battery energy" in equation (4) should be multiplied with the battery's discharging efficiency if the parameter is negative and divided by the battery's charging efficiency if the parameter is positive. However, these efficiencies are not mentioned in equation (4) above because the delta (difference) in the stored energy is negligible enough over a long period of time and charging and discharging efficiencies may be close enough to "1".

From equation (4), the overall storage efficiency—that is, efficiency of the system that can be attributed to battery storage, charge, and discharge cycles—can be given as:

$$\text{Storage efficiency} = [\text{Sum}(M_{out}) - (\text{change in stored battery energy})*(Eff_{IDC\text{-}AC})]/[\text{Sum}(S)*(Eff_{IDC\text{-}AC}) + \text{Sum}(M_{in})*(Eff_{IAC\text{-}DC})*(Eff_{IDC\text{-}AC})] \qquad (5)$$

When energy storage system efficiency in equation (5) is evaluated over long timeframes, such as, for example, over months or years, the change in the stored battery energy is insignificant in comparison to other energy flows in equation (5) and, hence, it can be ignored. In that case, equation (5) may be simplified to:

$$\text{Storage efficiency} = \text{Sum}(M_{out})/[\text{Sum}(S)*(Eff_{IDC\text{-}AC}) + \text{Sum}(M_{in})*(Eff_{IAC\text{-}DC})*(Eff_{IDC\text{-}AC})] \qquad (6)$$

In particular embodiments, the monitoring unit 30 may be programmed to use the equation (6) above to determine efficiency of the energy storage, such as the storage unit 26 in FIG. 2, and the impact of the storage efficiency for the system as a whole.

In the equations (4)-(6) above, the parameter "$Eff_{IDC\text{-}AC}$" is the DC-to-AC conversion efficiency of the inverter (not shown) in the inverter unit 24, and the parameter "$Eff_{IAC\text{-}DC}$" is the AC-to-DC conversion efficiency of the inverter. Like the known or estimated inverter efficiency ($Eff_I$) discussed before, the inverter efficiencies $Eff_{IAC\text{-}DC}$ and $Eff_{IDC\text{-}AC}$ also may be obtained or estimated as follows:

1. Nominal values for inverter-specific $Eff_{IAC\text{-}DC}$ and $Eff_{IDC\text{-}AC}$ may be obtained from the known inverter efficiency curves.

2. In one embodiment, when disaggregated flows for B are available in the form of the parameters "$B_{in}$" (energy flow into the storage unit 26) and "$B_{out}$" (energy flow out of the storage unit 26), then the ratio $M_{out}/S$ may be used by the monitoring unit 30 during a time interval when $B_{in}$=0 and $B_{out}$=0 to estimate the efficiency $Eff_{IDC\text{-}AC}$. On the other hand, during a time interval when S=0, $B_{out}$=0, and $B_{in}$ is positive, the monitoring unit 30 may use the ratio $B_{in}/M_{in}$ to estimate the efficiency $Eff_{IAC\text{-}DC}$.

The values of $Eff_{IAC\text{-}DC}$ and $Eff_{IDC\text{-}AC}$ obtained or estimated as noted above can be substituted in equation (6) to determine the overall storage efficiency and its impact for the system as a whole.

Case 3: Inverter can charge energy storage from grid power (that is, AC to DC conversion is present) and disaggregated (directional) flows for B and M are not available. When disaggregated (directional) flows are not available, short time interval based sampling may be used by the monitoring unit 30 to determine B and M values, while assuming that the flow direction for B and M are constant within the given time interval. Based on this assumption, measured values may be added by the monitoring unit 30 into separate "buckets" (like a storage memory location or register) based on direction so that the approach presented in this case can be used. For example, if "$B_{in}$" is the battery inflow during a short time interval such as, for example, 5 minutes, its magnitude may be added to a register designated as a "$B_{in}$ register". Similarly, if "$B_{out}$" is the battery outflow during a short 5-minute time interval, its magnitude may be added to a register designated as a "$B_{out}$ register". For M, if the 5 minute interval energy flow is from the grid to the inverter, it may be added to a register designated as an "$M_{in}$ register," and if the 5 minute interval energy flow is from the inverter to the grid, it may be added to a register designated as an "$M_{out}$ register." The registers or memory locations may be part of a memory—such as the memory 59 in FIG. 4—in the monitoring unit 30. The monitoring unit 30 may then use equation (6) with the disaggregated values of B and M determined by the monitoring unit 30 based on short time interval sampling to calculate the overall efficiency of the storage unit 26 and its operation, and the impact of the storage efficiency for the system as a whole.

The table below summarizes the processing to be done by the monitoring unit 30 in each of the three cases discussed above:

|  | Inverter can charge battery from grid | Inverter cannot charge battery from grid |
| --- | --- | --- |
| Disaggregated flows available | Case 2: Use equation (6) to determine system storage efficiency | Case 1: Use equation (3) to determine storage efficiency |
| Disaggregated flows not available | Case 3: Disaggregate flows by short time interval sampling, then use equation (6) to determine storage efficiency | Case 1: Use equation (3) to determine storage efficiency |

FIG. 4 depicts an exemplary block diagram of a monitoring unit, such as the monitoring unit 30 in FIG. 2, according to one embodiment of the present disclosure. The monitoring unit 30 may be suitably configured—in hardware and/or software—to implement the storage-independent measurement of renewable source production and determination of system storage efficiency according to the teachings of the present disclosure. The monitoring unit 30 may include a processor 55 and ancillary hardware to accomplish various processing aspects discussed before. The processor 55 may be configured to interface with a number of external devices. In one embodiment, a number of input devices 57 may be part of the monitoring unit 30 and may provide data inputs—such as user input, and the like—to the processor 55 for further processing. The input devices 57 may include, for example, a touchpad, a camera, an image sensor, a proximity sensor, a Global Positioning System (GPS) sensor, a computer keyboard, a touch-screen, a joystick, a physical or virtual "clickable button," a computer mouse/pointing device, and the like. In FIG. 4, the processor 55 is shown coupled to a system memory 59, a peripheral storage unit 60, one or more output devices 62, and a network interface (or interface unit) 63. A display screen is an example of an output device 62. In some embodiments, the unit 30 may include more than one instance of the devices shown.

In various embodiments, all of the components shown in FIG. 4 may be housed within a single housing. Thus, the monitoring unit 30 may be configured as a standalone computer or data processing system—such as, for example, a laptop or a desktop computer, a mobile device, a tablet computer, or a single-board computer—or in any other suitable form factor. In some embodiments, the monitoring unit 30 may be configured as a client system rather than a server system. In other embodiments, the monitoring unit 30 may be a mobile wireless device such as, for example, a cellular phone, a smartphone or tablet, or a User Equipment (UE), suitably configured to perform various tasks as per teachings of the present disclosure.

In particular embodiments, the monitoring unit 30 may include more than one processor (e.g., in a distributed processing configuration). When the monitoring unit 30 is a multiprocessor system, there may be more than one instance of the processor 55 or there may be multiple processors coupled to the processor 55 via their respective interfaces (not shown). The processor 55 may be a System on Chip (SoC) and/or may include more than one Central Processing Units (CPUs).

The system memory 59 may be any semiconductor-based storage system such as, for example, Dynamic Random Access Memory (DRAM), Static RAM (SRAM), Synchronous DRAM (SDRAM), Rambus® DRAM, flash memory, register-based storage, various types of Read Only Memory (ROM), and the like. In some embodiments, the memory 59 may include multiple different types of semiconductor memories, as opposed to a single type of memory. In other embodiments, the memory 59 may be a non-transitory data storage medium.

The peripheral storage unit 60, in various embodiments, may include support for magnetic, optical, magneto-optical, or solid-state storage media such as hard drives, optical disks (such as Compact Disks (CDs) or Digital Versatile Disks (DVDs)), Non-volatile Random Access Memory (NVRAM) devices, Secure Digital (SD) memory cards (including MicroSD memories), Universal Serial Bus (USB) memories, and the like. In some embodiments, the peripheral storage unit 60 may be coupled to the processor 55 via a standard peripheral interface such as a Small Computer System Interface (SCSI) interface, a Fibre Channel interface, a Firewire® (IEEE 1394) interface, a Peripheral Component Interface Express (PCI Express™) standard based interface, a USB protocol based interface, a Bluetooth® interface, or another suitable interface. Various such storage devices may be non-transitory data storage media.

As mentioned earlier, a display screen may be an example of the output device 62. Other examples of an output device include a graphics/display device, a Liquid Crystal Display (LCD) screen, a computer screen, an alarm system, a CAD/CAM (Computer Aided Design/Computer Aided Machining) system, a smartphone display screen, or any other type of data output device. In some embodiments, the input device(s) 57 and the output device(s) 62 may be coupled to the processor 55 via an I/O (Input/Output) or peripheral interface(s).

In one embodiment, the network interface 63 may communicate with the processor 55 to enable the unit 30 to couple to a communication network such as, for example, the Internet. In another embodiment, the interface unit 63 may provide the electrical connectivity—wired or wireless—to communicate with various units, such as the units 22, 24, 26, 28, and dedicated sub-metering equipment, if any, in the system 20 in FIG. 2. In one embodiment, the network interface 63 may be absent altogether. The interface unit 63 may include any suitable devices, media and/or protocol content for connecting the mobile unit 30 to a network—whether wired or wireless—and also to various equipment in the system 20. In various embodiments, as mentioned before, the network may include a Local Area Network (LAN), a Wide Area Network (WAN), a wired or wireless Ethernet, a telecommunication network, or other suitable type of network.

The monitoring unit 30 may include an on-board power supply unit 65 (which may be optional in some embodiments) to provide electrical power to various system components illustrated in FIG. 4. The power supply unit 65 may receive batteries or may be connectable to an AC electrical power outlet. In one embodiment, the power supply unit 65 may convert solar energy or other renewable energy into electrical power.

In one embodiment, a non-transitory, computer-readable data storage medium, such as, for example, the system memory 59 or a peripheral data storage unit, such as a MicroSD memory card, may store program code or software. The processor 55 may be configured to execute the program code, whereby the monitoring unit 30 may be operative to perform the renewable source production measurement and storage efficiency determination as discussed hereinbefore—such as, for example, the operations discussed earlier with reference to FIGS. 2-3. The program code or software may be proprietary software or open source software which, upon execution by the processor 55 may enable the monitoring unit 30 to receive time interval based energy flow data from different entities in the renewable energy system 20, use the received data to determine the production measurement for a renewable source in a storage-independent manner, derive system storage efficiency from data received over a long period of time using various equations, and so on.

In the preceding description, for purposes of explanation and not limitation, specific details are set forth (such as particular architectures, interfaces, techniques, etc.) in order to provide a thorough understanding of the disclosed technology. However, it will be apparent to those skilled in the art that the disclosed technology may be practiced in other embodiments that depart from these specific details. That is, those skilled in the art will be able to devise various arrangements which, although not explicitly described or shown herein, embody the principles of the disclosed technology. In some instances, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, such as, for example, any elements developed that perform the same function, regardless of structure.

Thus, for example, it will be appreciated by those skilled in the art that block diagrams herein (e.g., in FIGS. 2 and 4) can represent conceptual views of illustrative circuitry or other functional units embodying the principles of the technology. Similarly, it will be appreciated that the flowchart in FIG. 3 represents various processes which may be substantially performed by a processor (e.g., the processor 55 in FIG. 4). Such a processor may include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Some or all of the functionalities described above in the context of FIGS. 2-3 also may be provided by such a processor, in the hardware and/or software. The processor 55 may employ distributed processing in certain embodiments.

When certain inventive aspects require software-based processing, such software or program code may reside in a computer-readable data storage medium. As noted earlier, such data storage medium may be part of the peripheral storage 60, or may be part of the system memory 59, or the processor's 55 internal memory (not shown). In one embodiment, the processor 55 may execute instructions stored on such a medium to carry out the software-based processing. The computer-readable data storage medium may be a non-transitory data storage medium containing a computer program, software, firmware, or microcode for execution by a general purpose computer or a processor mentioned above. Examples of computer-readable storage media include a ROM, a RAM, a digital register, a cache memory, semiconductor memory devices, magnetic media such as internal hard disks, magnetic tapes and removable disks, magneto-optical media, and optical media such as CD-ROM disks and DVDs.

Alternative embodiments of the monitoring unit 30 according to inventive aspects of the present disclosure may include additional components responsible for providing additional functionality, including any of the functionality identified above and/or any functionality necessary to support the solution as per the teachings of the present disclosure. Although features and elements are described above in particular combinations, each feature or element can be used alone without the other features and elements or in various combinations with or without other features. As mentioned before, various monitoring unit-based processing functions discussed herein may be provided through the use of hardware (such as circuit hardware) and/or hardware capable of executing software/firmware in the form of coded instructions or microcode stored on a computer-readable data storage medium (mentioned above). Thus, such functions and illustrated functional/flowchart blocks are to be understood as being either hardware-implemented and/or computer-implemented, and thus machine-implemented.

The foregoing describes a system and method in which production measurement for renewable energy is obtained in a storage-independent manner—in a form that would be comparable to renewable installations without storage. Thus, energy storage is separated out from the renewable generation to provide individual performance analytics for both. A monitoring unit uses device communication and metering to enable revenue-grade production measurement for a renewable source and energy storage periodically at specified time intervals. The production measurement for a renewable source is obtained in a form that would be comparable to renewable installations without storage, which is important for accurate billing, maintenance, and performance analytics. Additionally, multiple energy flows may be used by the monitoring unit to arrive at a storage efficiency value that can be attributed to the storage unit as well as how the storage unit is operated in the renewable energy system. Thus, the storage efficiency quantifies efficiency losses arising from the use of a storage unit to estimate the actual impact of storage and, possibly, the charge controller algorithm on energy production.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

What is claimed is:

1. A method for measuring production of renewable energy in a storage-independent manner in a renewable energy system, said method comprising:
determining each of the following values during a predetermined time interval:
an "S" value, wherein the S value is an interval-specific magnitude of a first Direct Current (DC) energy flow from a renewable energy source to an intermediate unit in the renewable energy system, wherein the intermediate unit includes an inverter and a charge controller;
an "M" value, wherein the M value is an interval-specific magnitude of an Alternating Current (AC) energy flow between the intermediate unit and an AC interconnect point in the renewable energy system; and
a "B" value, wherein the B value is an interval-specific magnitude of a second DC energy flow between the intermediate unit and a DC storage unit in the renewable energy system; and using the S, M, and B values to calculate a portion of the interval-specific AC energy flow attributable only to the interval-specific first DC energy flow excluding contribution to the AC energy flow from the DC storage unit to provide a storage-independent measurement of production of renewable energy.

2. The method of claim 1, further comprising:
generating pricing for the interval-specific first DC energy flow based on the calculated portion of the interval-specific AC energy flow.

3. The method of claim 1, wherein the renewable energy is solar energy, and wherein the renewable energy system is a Photovoltaic (PV) solar system.

4. The method of claim 1, wherein the portion is one of the following:
a first ratio calculated as M*S/(S+B) when the renewable energy source is net generating, the DC storage unit is net discharging, and net AC energy flow from the intermediate unit to the AC interconnect point is positive; and
a second ratio calculated as M*S/(S−B) when the renewable energy source is net generating, the DC storage unit is net charging, and net AC energy flow from the intermediate unit to the AC interconnect point is positive.

5. The method of claim 1, wherein using the S, M, and B values includes:
estimating an efficiency factor for the inverter using the S, M, and B values; and
multiplying the efficiency factor with the S value to calculate the portion.

6. The method of claim 1, wherein the portion is a ratio calculated as M*S*E/(B−S) when the renewable energy source is net generating, the DC storage unit is net charging, and net AC energy flow from the intermediate unit to the AC interconnect point is negative, wherein "E" is a round-trip efficiency factor for the inverter.

7. The method of claim 1, further comprising:
determining the following when the inverter is inoperable to charge the DC storage unit using AC energy from the AC interconnect point:
a sum of S values, wherein each S value in the sum is associated with a corresponding one of a plurality of pre-determined time intervals, and
a sum of M values, wherein each M value in the sum is associated with a corresponding one of the plurality of pre-determined time intervals; and
calculating overall efficiency of the DC storage unit and operation thereof using the sum of S values, the sum of M values, and an efficiency factor for the inverter.

8. The method of claim 1, further comprising:
determining the following when the inverter is operable to charge the DC storage unit using AC energy from the AC interconnect point:
a sum of S values, wherein each S value in the sum is associated with a corresponding one of a plurality of pre-determined time intervals,
a sum of $M_{out}$ values, wherein each $M_{out}$ value is associated with a corresponding one of the plurality of pre-determined time intervals, and wherein each $M_{out}$ value is an interval-specific magnitude of the AC energy flow from the inverter into the AC interconnect point, and
a sum of $M_{in}$ values, wherein each $M_{in}$ value is associated with a corresponding one of the plurality of pre-determined time intervals, and wherein each $M_{in}$ value is an interval-specific magnitude of the AC energy flow from the AC interconnect point into the inverter; and
calculating overall efficiency of the DC storage unit and operation thereof using the sum of S values, the sum of $M_{out}$ values, the sum of $M_{in}$ values, a DC-to-AC conversion efficiency factor for the inverter, and an AC-to-DC conversion efficiency factor for the inverter.

9. The method of claim 1, wherein the storage-independent measurement can be used for at least one of billing, maintenance, and performance analytics.

10. The method of claim 5, wherein estimating the efficiency factor includes:
estimating the efficiency factor as a ratio of the M value divided by the S value when the B value is zero.

11. A monitoring unit for measuring production of renewable energy in a storage-independent manner in a renewable energy system, said monitoring unit is operable to perform the following:
determine each of the following values during a pre-determined time interval:
an "S" value, wherein the S value is an interval-specific magnitude of a first Direct Current (DC) energy flow from a renewable energy source to an intermediate unit in the renewable energy system, wherein the intermediate unit includes an inverter and a charge controller,
an "M" value, wherein the M value is an interval-specific magnitude of an Alternating Current (AC) energy flow between the intermediate unit and an AC interconnect point in the renewable energy system, and
a "B" value, wherein the B value is an interval-specific magnitude of a second DC energy flow between the intermediate unit and a DC storage unit in the renewable energy system,
use the S, M, and B values to calculate a portion of the interval-specific AC energy flow attributable only to the interval-specific first DC energy flow excluding contribution to the AC energy flow from the DC storage unit to provide a storage-independent measurement of production of renewable energy; wherein the storage-independent measurement can be used for at least one of billing; maintenance, and performance analytics; and
generate pricing for the interval-specific first DC energy flow based on the calculated portion of the interval-specific AC energy flow.

12. The monitoring unit of claim 11; wherein the monitoring unit is operable to further perform at least one of the following:
calculate the portion as a first ratio given by M*S/(S+B) when the renewable energy source is net generating; the DC storage unit is net discharging; and net AC energy flow from the intermediate unit to the AC interconnect point is positive;
calculate the portion as a second ratio given by M*S/(S−B) when the renewable energy source is net generating; the DC storage unit is net charging; and net AC energy flow from the intermediate unit to the AC interconnect point is positive; and
calculate the portion as a ratio given by M*S*E/(B-S) when the renewable energy source is net generating; the DC storage unit is net charging; and net AC energy flow from the inverter in the intermediate unit to the AC interconnect point is negative; wherein "E" is a round-trip efficiency factor for the inverter.

13. The monitoring unit of claim 11; wherein the monitoring unit is operable to further perform the following:
   estimate an efficiency factor for the inverter using the S; M; and B values; and
   calculate the portion by multiplying the efficiency factor with the S value.

14. The monitoring unit of claim 11; wherein the monitoring unit is operable to further perform the following:
   when the inverter in the intermediate unit is inoperable to charge the DC storage unit using AC energy from the AC interconnect point; calculate overall efficiency of the DC storage unit and operation thereof using a first plurality of S values associated with a first plurality of time intervals; a first plurality of M values associated with the first plurality of time intervals; and an efficiency factor for the inverter; and
   when the inverter is operable to charge the DC storage unit using AC energy from the AC interconnect point, calculate the overall efficiency of the DC storage unit and operation thereof using a second plurality of S values associated with a second plurality of time intervals, a second plurality of M values associated with the second plurality of time intervals, a DC-to-AC conversion efficiency factor for the inverter, and an AC-to-DC conversion efficiency factor for the inverter.

15. A data storage medium operable with a monitoring unit in a renewable energy system and containing program instructions, which, when executed by the monitoring unit, cause the monitoring unit to perform the following:
   determine each of the following values during a predetermined time interval:
      an "S" value, wherein the S value is an interval-specific magnitude of a first Direct Current (DC) energy flow from a renewable energy source to an intermediate unit in the renewable energy system, wherein the intermediate unit includes an inverter and a charge controller,
      an "M" value, wherein the M value is an interval-specific magnitude of an Alternating Current (AC) energy flow between the intermediate unit and an AC interconnect point in the renewable energy system, and
      a "B" value, wherein the B value is an interval-specific magnitude of a second DC energy flow between the intermediate unit and a DC storage unit in the renewable energy system, and
   use the S, M, and B values to calculate a portion of the interval-specific AC energy flow attributable only to the interval-specific first DC energy flow excluding contribution to the AC energy flow from the DC storage unit to provide a stnragenindependent measurement of production of renewable energy.

16. The data storage medium of claim 15, wherein the program instructions, when executed by the monitoring unit, cause the monitoring unit to generate pricing for the interval-specific first DC energy flow based on the calculated portion of the interval-specific AC energy flow.

17. The data storage medium of claim 15, wherein the program instructions, when executed by the monitoring unit, cause the monitoring unit to further perform at least one the following:
   calculate the portion as a first ratio given by M*S/(S+B) when the renewable energy source is net generating, the DC storage unit is net discharging, and net AC energy flow from the intermediate unit to the AC interconnect point is positive;
   calculate the portion as a second ratio given by M*S/(S-B) when the renewable energy source is net generating, the DC storage unit is net charging, and net AC energy flow from the intermediate unit to the AC interconnect point is positive; and
   calculate the portion as a third ratio given by M*S*E/(B-S) when the renewable energy source is net generating, the DC storage unit is net charging, and net AC energy flow from the inverter in the intermediate unit to the AC interconnect point is negative, wherein"E" is a round-trip effIciency factor for the inverter.

18. The data storage medium of claim 15, wherein the renewable energy is solar energy, and wherein the renewable energy system is a Photovoltaic (PV) solar system.

* * * * *